United States Patent [19]
Berkhout et al.

[11] Patent Number: 4,736,163
[45] Date of Patent: Apr. 5, 1988

[54] CIRCUIT FOR DETECTING AND SUPPRESSING PULSE-SHAPED INTERFERENCES

[75] Inventors: Petrus J. Berkhout; Johan M. Rijnsburger, both of Eindhoven, Netherlands

[73] Assignee: U.S. Philips Corporation, New York, N.Y.

[21] Appl. No.: 756,140

[22] Filed: Jul. 17, 1985

[30] Foreign Application Priority Data

Jul. 23, 1984 [NL] Netherlands ............... 8402322

[51] Int. Cl.$^4$ .................. H03B 1/00; H03K 5/22
[52] U.S. Cl. ...................... 328/162; 328/115; 328/150; 328/117; 307/358; 307/350
[58] Field of Search ............ 307/354, 356, 358; 328/150, 162, 111, 112, 114, 116, 117

[56] References Cited

U.S. PATENT DOCUMENTS

| 3,283,303 | 11/1966 | Cerf | 307/354 |
| 4,156,202 | 5/1979 | Takahashi | 307/358 |
| 4,175,256 | 11/1979 | Dolikian | 307/358 |
| 4,267,515 | 5/1981 | Terui et al. | 307/358 |
| 4,358,738 | 11/1982 | Kahn | 307/358 |
| 4,427,901 | 1/1984 | Tomuro | 307/356 |
| 4,575,683 | 3/1986 | Roberts et al. | 307/354 |

Primary Examiner—Stanley D. Miller
Assistant Examiner—Timothy P. Callahan
Attorney, Agent, or Firm—Rolf E. Schneider; William J. Streeter; Anne E. Barschall

[57] ABSTRACT

The circuit arrangement for detecting pulse-shaped interferences in an electrical signal comprises an input (7), a high-pass filter (8) having a cut-off frequency lying between 40 Hz and 1000 Hz, one or two signal paths (25, 25') and an output (5). A signal path (25) comprises a peak detector (10), a device (11) for determining a running average value, of its input signal, a delay unit (12) and a comparator (15). The output of the peak detector (10) is coupled via the device (11) for determining a running average value to a first input (13) of the comparator and via the delay unit (12) to a second input (14) of the comparator. The comparator compares the delayed output signal of the peak detector with the output signal of the device for determining the running average value and supplies an output signal to its output (16) if the output signal of the peak detector is larger than a times the output signal of the device for determining the running average value, where it holds that a>1. With this circuit arrangement, a more satisfactory detection of pulse-shaped interferences is attained (FIG. 3). The circuit arrangement may be used, for example, as a detector circuit in an arrangement for detecting and suppressing pulse-shaped interferences. (FIG. 1).

13 Claims, 5 Drawing Sheets

FIG.10 PEAK DETECTOR OUTPUT SIGNAL

CIRCUIT FOR DETECTING AND SUPPRESSING PULSE-SHAPED INTERFERENCES

The invention relates to a circuit for detecting pulse-shaped interferences in an electrical signal comprising
an input for receiving the signal,
a high-pass filter coupled to the input terminal,
an output for supplying an output signal.

The invention further relates to a circuit for suppressing pulse-shaped interferences in an electrical signal having an input terminal for receiving the signal, an output terminal for supplying an output signal and a suppressor section connected between the input terminal and the output terminal. A control input for receiving a control signal is provided coupled to the circuit for detecting pulse-shaped interferences. The circuit of the kind mentioned in the opening paragraph is known from Dutch Patent Application No. 7712534 (PHN. 8932) laid open to public inspection. Such circuit are used, for example, as an interference detector in a scratch noise suppressor, as also described in the aforementioned Dutch Patent Application laid open to public inspection. As soon as a pulse-shaped interference is detected, the signal originating, for example, from a gramophone record is varied during a first period of time from a working level to a suppression level, at which latter level the signal has a minimum value, is maintained during a second period of time at the suppression level. The signal is varied during a third period of time from the suppression level to the working level.

It is also possible to use the circuit for detecting a pulse-shaped interference in which, after detection of the pulse-shaped interference, there is a change over from a stereo reproduction to a mono reproduction and then back again to a stereo reproduction. Alternatively, after detection of the pulse-shaped interference, the high frequency reproduction is temporarily suppressed.

The known circuit for detecting pulse-shaped interferences has the disadvantage that on the one hand it gives off rather frequently a false alarm—that is to say that it indicates that a pulse-shaped interference has been detected, although no interference occurred due to the fact that the signal itself has a rather pulseshaped character, for example the sound of a clarinet. On the other hand sometimes it does not detect conspicuous pulse-shaped interferences.

SUMMARY OF THE INVENTION

The invention has for its object to provide a circuit for detecting pulse-shaped interferences, which can make a clearer distinction between pulse-shaped interferences and the pulse-shaped variations in the desired signal so that a false alarm occurs less frequently and it happens less frequently that an interference is not detected.

The circuit according to the invention is characterized in that it is provided with at lease one signal path comprising
a peak detector, constructed to produce an output signal having a relatively short build-up time so that it becomes representative of the value of a peak in a signal applied to the detector input relatively rapidly and a relatively long decay time so that it decays relatively slowly thereafter, the input of the peak detector being coupled to the output of the high-pass filter.
a device for determining an average value having an input coupled to an output of the peak detector for determining the running average value of the output signal of the peak detector and for supplying an outut signal representative of this running average value to an output,
a comparator having a first and a second input coupled to the output of the device for determining an average value and to an output of the peak detector, respectively, for comparing the output signal of the peak detector with an output signal of the device for determining an average value and for supplying an output signal representative of the result of this comparison to an output.

The circuit is further preferably characterized in that the high-pass filter has a cut-off frequency lying between 40 Hz and 1000 Hz and/or in that a delay unit is connected between the output of the peak detector and the second input of the comparator. The measure according to the invention is based on the recognition of the fact that the domain of time can be considered rather than the domain of frequency for detecting pulse-shaped interferences. For this purpose, a cut-off frequency of low value is preferably chosen for the high-pass filter lying between 40 and 1000 Hz for eliminating direct voltage components and "rumble". This in contrast with the known circuit in which the cut-off frequency lies at 8 to 10 kHz. When a much lower cut-off frequency is chosen, a much larger signal content is obtained so that interferences can be detected much more successfully. Due to the fact that the electrical signal is considered in the time domain use should be made of a peak detector and a device for determining an average value. The average peak level and the deviation of the peaks from the average peak level can now be determined. The output signal of the peak detector, which has to follow the rising part of the peaks relatively rapidly, that is to say has to have a relatively short build-up time, is essential to this end. Moreover, after detecting a pulse-shaped interference having a high amplitude, the circuit has to be insensitive for a certain time in order to avoid that too large a number of pulse-shaped interference are detected successively in a short time. This is the reason for the relatively long decay time of the peak detector output signal.

In order to obtain a given detection criterion, the circuit according to the invention can further be characterized in that the comparator is adapted to supply an output signal to the output of the circuit if the absolute value of the present output signal of the peak detector exceeds a times the absolute value of the running average value over time of the output signal of the peak detector, a being a constant for which it holds that a > 1. The detection criterion for a pulse-shaped interference therefore is that the amplitude of the peak has to be larger than a times the average value of the peak level. When this detection criterion is chosen, a correct selection between on the one hand pulse-shaped interferences and on the other hand signal peaks in the desired electrical signal can be obtained.

In the case of detection of signal peaks, detection of only the signal peaks having a positive polarity or detection of only the signal peaks having a negative polarity or detection of signal peaks having both positive and negative polarities may be concerned. In the case of detection of only the negative signal peaks, the circuit comprises only one signal path. In the case of detection of only negative signal peaks, the peak detection can be preceded by an inverting element so that also in this case the peak detector in fact detects signal peaks having a positive polarity.

The detection of signal peaks having a positive polarity as well as of signal peaks having a negative polarity is to be preferred, however. A pulse-shaped interference can be detected sometimes from the signal peaks having a positive polarity and sometimes only from a signal peak having a negative polarity. When therefore both the signal peaks having a positive polarity and the signal peaks having a negative polarity are concerned, a more satisfactory detection of pulse-shaped interferences is obtained. The first embodiment of the circuit according to the invention is characterized for this purpose in that it comprises only one signal path and in that a rectifier is connected between the output of the high-pass filter and the input of the peak detector.

The full-wave rectifier is required to rectify the signal parts of negative polarity to signal parts of positive polarity. The rectified signal is than supplied to the peak detector. Another embodiment of such a circuit is characterized in that itcomprises two parallel extending signal paths and a combination circuit, the peak detector in one signal channel being constructed to detect peaks of one polarity in its input signal and the peak detector in the other signal channel being constructed to detect peaks of the other polarity in its input signal. A first and a second input of the combination circuit are coupled to an output of the comparator in one signal path and an output of the comparator in the other signal path, respectively, for combining the output signals of the comparators. An output of the combination circuit is coupled to the output of the circuit. Also in this manner, both signal peaks having a positive polarity and signal peaks having a negative polarity are detected. The peak detectors in both signal paths may be of similar construction except for the fact that the peak detector in the second signal path includes an additional inverting element in its input circuit.

The last-mentioned alternative is to be preferred to the first because in general it enables a more satisfactory detection of pulse-shaped interferences. The average value of the negative signal peaks may be, for example, smaller than the average value of the positive signal peaks. A signal peak having a negative polarity, which is larger than a times the average (negative) peak level, will be considered in the second embodiment as a pulse shaped interference. If this signal peak as to the amplitude is smaller than a times the average (positive) peak level, this signal peak will not be recognized by the first-mentioned embodiment as a pulse-shaped interference, though it is a pulse-shaped interference indeed, as stated above.

The embodiment of the circuit arrangement comprising one signal path can further be characterized in that a pulse former is included between the output of a comparator and the output and is provided with an output for supplying a pulse each time when a pulse-shaped interference is detected by the comparator. The embodiment comprising two signal paths may further be characterized in that the combination circuit comprises a signal combination unit having a first and a second input which are coupled to the first and the second input, respectively, of the combination circuit and an output, as well as a pulse former coupled to the output of the combination unit for supplying a pulse each time when a pulse-shaped interference is detected by one of the comparators. Thus, pulses are generated each time when a pulse-shaped interference is detected, which pulses can be used for a further conversion to a control signal.

The circuit can further be characterized in that a pulse lengthening device is coupled to the output of the pulse former for lengthening the pulses of the pulse former up to a given minimum pulse width and for lengthening these pulses only when further by a value corresponding to the time interval between the relevant pulses and the succeeding pulses if this time interval is smaller than the said minimum pulse width. In this manner, pulses having a minimum pulse width are obtained, which pulse width has to be chosen at least so large that the instant at which the pulse-shaped interference occurs, considered in time, can be bridged. If several pulse-shaped interferences occur in immediate order of succession, these interferences can be suppressed in one step by lengthening of the pulse width of the pulses supplied by the pulse lengthening device.

Figure 1:
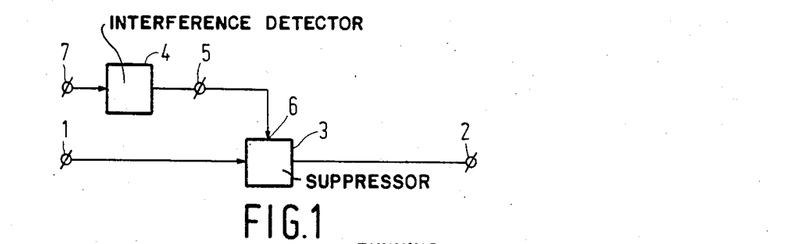
FIG. 1 shows a circuit for suppressing pulse-shaped interferences.

The further processing of the output pulses of the pulse lengthening device depends upon the manner in which the interferences are compensated. In order to be able to use the circuit according to the invention in an arrangement for suppressing pulse-shaped interferences, as described in Dutch Patent Application No. 7712534 laid open to public inspection, the output signal of the pulse lengthening device can then be supplied to a low-pass filter. As output signal which is approximately the curve as indicated in FIG. 1a of the aforementioned Patent Application can then be obtained. This output signal can therefore serve as a control signal for the interference suppression in the known suppressor circuit arrangement.

The peak detector in the circuit can be characterized in that it comprises a first and a second signal combination unit, in that the input of the peak detector is coupled, as the case may be through a first amplifier stage, to a first input of both the first and the second signal combination unit. An output of the first signal combination unit is coupled through a device for determining an absolute value to a second input of the second signal combination unit. An output of the second signal combination unit is coupled to the output of the peak detector and a delay element and, as the case may be a second amplifier stage, to both a second input of the first signal combination unit and a third input of the second combination unit. Thus, a peak detector can be obtained which is capable of detecting peaks having a positive polarity. The first amplifier stage, if present, should then not have an inverting effect. The peak detector may also be used for detecting peaks having a negative polarity. The first amplifier stage then should having an inverting effect.

The pulse former in the circuit can be characterized in that it comprises a first and a second signal combination unit. An input of the pulse former is coupled to a first input and through a delay element to a second input of the first signal combination unit. An output of the first signal combination unit is coupled, as the case may be through an amplifier stage, to a first input of the second signal combination unit and through a device for determining an absolute value to a second input of the second signal combination unit, of which an output is coupled to the output of the pulse former.

The pulse lengthening device in the circuit can be characterized in that is comprises a first and a second signal combination unit and a limiter. An input of the pulse lengthening device is coupled to a first input of the first signal combination unit. An output of the first signal combination unit is coupled through the limiter, a delay element and, as the case may be, an amplifier stage to a second input of the signal combination unit. An output of the limiter is coupled to a first input of the second signal combination unit, of which a second input serves to suply a constant signal and of which an output is coupled to an output of the pulse lengthening device.

The invention will be described more fully here hereinafter with reference to the description of the Figures, in which like reference numerals in the Figures designate like elements.

DESCRIPTION OF THE PREFERRED EMBODIMENT

FIG. 1 shows the circuit for detecting and suppressing pulse-shaped interferences provided with an input terminal 1, an output terminal 2, a suppressor section 3 and a device 4 for detecting pulse-shaped interferences. The output 5 of the device 4 is coupled to a control input 6 of the suppressor section 3 for supplying a control signal to the suppressor section. An audio signal (for example a stereo or mono signal) can be supplied through the input terminal 1 to the suppressor section 3. In case a mono signal is supplied to the input terminal 1, the same mono signal can be supplied to the device 4 through an input 7. If a stereo signal is concerned, which is supplied to the input terminal 1, for example, the (lefthand minus righthand) signal of the stereo signal is supplied to the input 7.

If the circuit of FIG. 1 is used in a radio receiver, for example, the intermediate-frequency signal is supplied to the input 7, while the intermediate-frequency signal can also be supplied to the input terminal 1.

The suppressor section 3 can operate according to the principle described in Dutch Patent Application No. 7712534 laid open to public inspection, but other compensation method for suppressing or compensating for pulse-shaped interferences are also possible.

Figure 2:
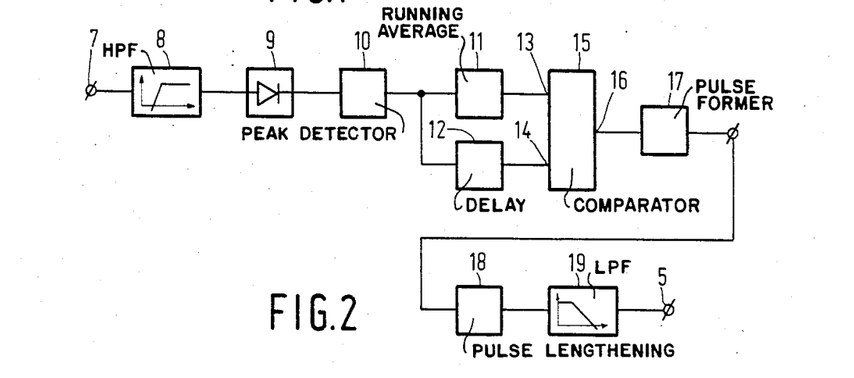
FIG. 2 shows a circuit for detecting pulse-shaped interferences provided with one signal path.

Two possible constructions for the device 4 for detecting pulse-shaped interferences will be described with reference to FIGS. 2 and 3. In FIG. 2, the input 7 is coupled to a peak detector 10 through a high-pass filter 8, whose cut-off frequency preferably lies between 40 Hz and 1000 Hz. The output of the peak detector 10 is coupled through a device 11 for determining a running average value and on the other hand through a delay unit 12 to a first and a second input 13 and 14, respectively, of a comparator 15.

The peak detector 10 for detecting peaks in the output signal of the filter 8 has a relatively short buildup time during which its output signal relatively rapidly becomes representative of a peak value of its input signal and a relatively long decay time during which it slowly decays thereafter. For detecting signal peaks having a positive polarity, the block denoted by reference numeral 9 can be omitted. For detecting only signal peaks having a negative polarity with the use of a similar detector 10, the block denoted by reference numeral 9 is an inverting element and can be incorporated in the detector 10. However, preferably both peaks having a negative polarity and peaks having a positive polarity are detected. In this case, the block denoted by reference numeral 9 is a full-wave rectifier. The device 11 for determining a running average value is intended to determined the running average value of the output sigal of the peak detector and to supply an output signal to its output corresponding to this average value. The delay unit 12, if necessary, is intended to delay the output signal of the peak detector 10 over the time the device 11 for determining a running average value needs to determine the value. The comparator 15 compares the delayed output signal of the peak detector 10 with the output signal of the device 11 and supplies an output signal to its output 16 if the absolute value of the output signal of the peak detector 10 exceeds a times the absolute value of the running average value of the output signal of the peak detector 10. a is then a constant for which it holds that a $>1$.

The choice of the value for a determines the criterion at which a peak is considered to be a signal peak of the desired signal or to be a pulse-shaped interference. If the value for a is chosen too small, that is to say substantially equal to 1, too large a number of peaks of the desired signal will be characterized as a pulse-shaped interference. If a is chosen too large, too large a number of pulse-shaped interferences are not recognized as such. Consequently, an optimum value should be found for a, at which an optimum interference detection can be obtained. It should be stated here that other detection criteria are also possible for detecting pulse-shaped interferences originating from the output signal of a peak detector.

The output signal of the comparator 15 should be converted to a control signal which is suitable to be supplied, for example, to the suppressor section 3 of FIG. 1. For this purpose, in FIG. 2 the output 16 of the comparator 15 is coupled to the output 5 via a pulse former 17, a pulse lengthening device 18 and a low-pass filter 19. The pulse former 17 supplies a signal each time when a pulse-shaped interference is detected by the comparator 15. The pulse lengthening device 18 is adapted to lengthen the pulses up to a given minimum pulse width and to lengthen these pulses by a value corresponding to the time interval between the relevant pulses and the succeeding pulses only then if this time interval is smaller than the said minimum pulse width.

As will appear below, there is obtained at the output 5 a signal with which a control can be realized as indicated in FIG. 1A of the Dutch Patent Application No. 7712534 laid open to public inspection.

Figure 3:
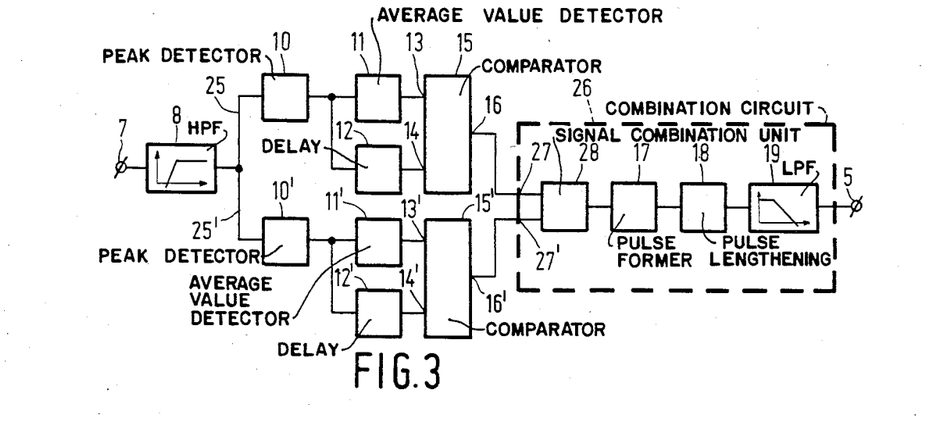
FIG. 3 shows a circuit for detecting pulse-shaped intereferences provided with two signal paths.

FIG. 3 shows another embodiment of the device 4 of FIG. 1. The device 4 in this case comprises two parallel extending signal paths 25 and 25', each signal path 25 and 25', respectively, comprising a peak detector 10 and 10', respectively, a device 11 and 11', respectively, for determining a running average value, a delay unit 12 and 12'—respectively, and a comparator 15 and 15', respectively. The peak detector 10 in one channel 25 is adapted to detect peaks having a positive polarity, while the peak detector 10' in the other channel 25' is adapted to detect peaks having a negative polarity. The peak detector 10' may be composed, for example, in the same manner as the peak detector 10. In this case, an inverting element should precede the peak detector in the signal path 25' and can if necessary be incorporated in the peak detector 10'. The device further comprises a combination circuit 26 having a first and a second input 27 and 27', respectively, coupled to the output 16 and 16', respectively, of the comparator 15 and 15', respectively, and an output coupled to the output 5 of the device.

The combination circuit 26 comprises a signal combination unit 28 having a first and a second input coupled to the first and the second input 27 and 27', respectively, of the combination circuit 26. The output of the signal combination unit 28 is coupled through the pulse former 17, the pulse lengthening device 18 and the low-pass filter 19 to the output 5.

A digital construction of the devices of FIGS. 2 and 3 will be described further in FIGS. 4 to 9, while FIGS. 10 to 14 shows the behaviour of a number of signals present at various points in the circuit of FIG. 3 as a function of time.

Figure 4:
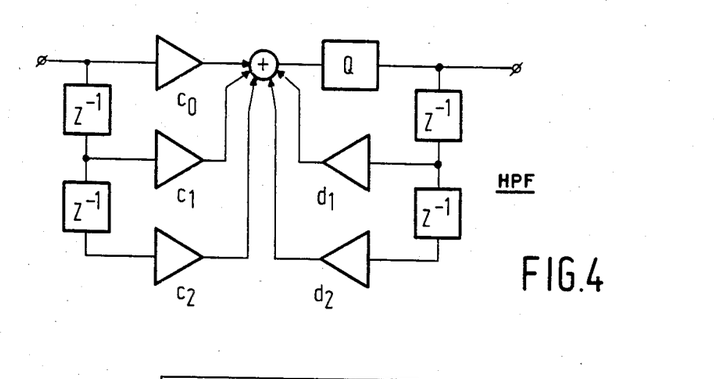
FIG. 4 shows a possible construction for the high-pass filter.

FIG. 4 shows the known circuit diagram of a second-order recursive digital filter which can be used as a high-pass filter 8 in FIGS. 2 or 3. The block denoted by Q is a quantizer (or word truncator) generally used in digital systems. The blocks designated by $z^{-1}$ are delay elements. The amplifiers (digital multipliers) produce the filter coefficients $c_0$, $c_1$, $c_2$, $d_1$ and $d_2$ which should be adjusted depending upon the kind of filter which is desired. For a Chebyshey filter of the type 1 having a maximum ripple of 1 dB in the pass band, these coefficients $c_0 = c_2 = 0.8786$, $c_1 = -1.7572$, $d_1 = -1.9713$ and $d_2 = 0.972$. In this case, maximum attenuation is obtained for the low frequencies.

The high-pass filter is required to suppress the direct voltage component and the low-frequency content of the signal supplied to the input 7. These direct voltage and low-frequency components would otherwise strongly influence the behaviour of the averaging filters which are used in the device 11 for determining a running average value to determine the running average peak value of the signals. The output signal of the high-pass filter 8 is indicated in FIG. 10 and 11 by a curve 110.

Figure 5:
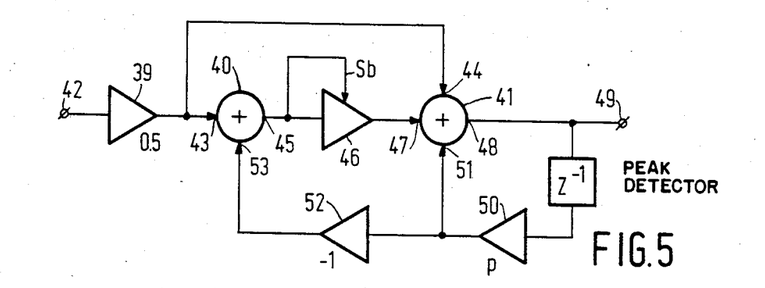
FIG. 5 shows a possible construction for a peak detector.

FIG. 5 shows a digital construction of the peak detector 10 in FIGS. 2 or 3. The peak detector is adapted to detect peaks having a positive polarity and comprises a first and a second signal combination unit 40 and 41, respectively. The input 42 is coupled, as the case may be through an amplifier stage 39, which in this case produces an attenuation by a factor 2, to a first input 43 and 44, respectively, of the first and the second signal combination unit 40 and 41, respectively. The output 45 is coupled through a device 46 for determining an absolute value, in which the digital numbers are multiplied by the sign (bit) Sb, to a second input 47 of the signal combination unit 41. The output 48 of the signal combination unit 41 is coupled on the one hand to the output 49 of the peak detector on the other hand through a delay element (the block indicated by $z^{-1}$) and an amplifier stage 50 to the third input 51 of the signal combination unit 41 and further through an inverter 52 to the second input 53 of the signal combination unit 40. The value p by which the signal in the amplifier stage 50 is multiplied determines the extent of the decay. For a sampling frequency of 44.1 kHz and a value for p of 0.499, a decay is realized corresponding to that which would be obtained with a first-order low-pass filter having a −3 dB point at 14 Hz.

The peak detector 10' may be constructed in the same manner as the peak detector 10. The additional signal inversion which had to be carried out in the signal path 25' before the peak detector 10' may be realized, for example, in the amplifier stage 39, i.e. by multiplication of the signal by the factor −0.5 instead of the factor 0.5.

Figure 10:
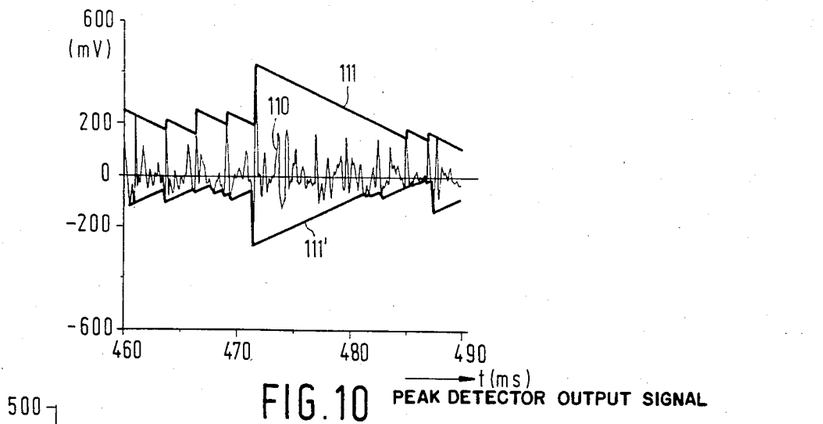
Figure 11:
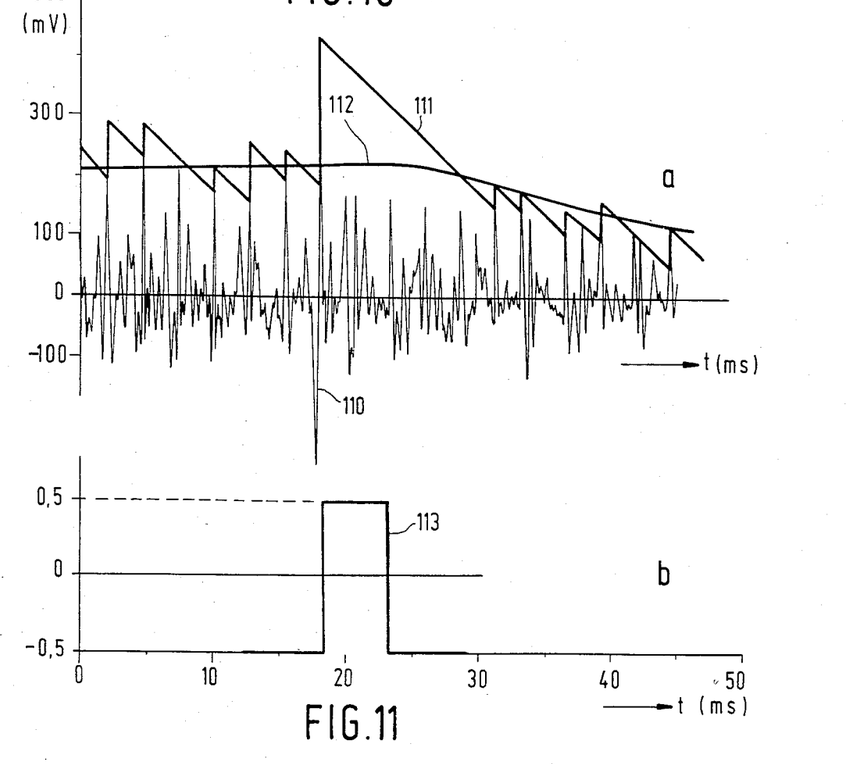

The output signal of the peak detector 10 is indicated in FIGS. 10 and 11 by 111. The output signal of the peak detector 10' (after again having been subjected to a signal inversion) is indicated by the curve 111' in FIG. 10.

Figure 6:
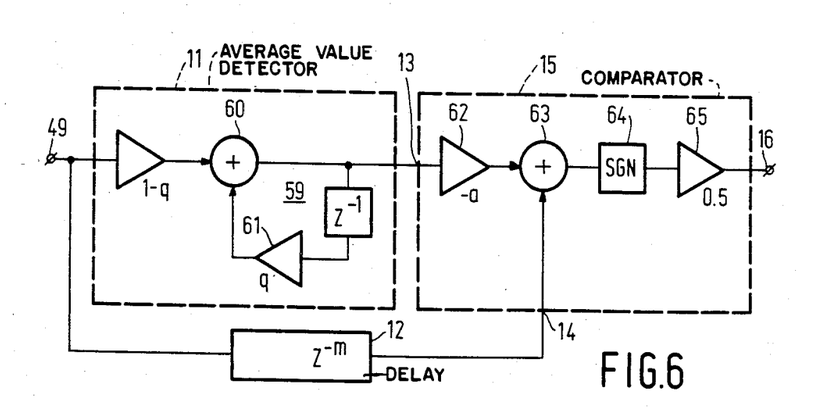
FIG. 6 shows a possible construction for the circuit comprising the device for determining an average value, the delay unit and the comparator.

FIG. 6 shows a digital construction of the device 11 for determining an average value, the delay unit 12 and the comparator 15 of FIGS. 2 or 3. In order to determine whether a pulse in the signal gives rise to an excessive peak level, the average peak level is determined in the device 11 for determining a running average value, which is in the form of a simple first-order recursive filter 59, which is composed of the signal combination unit 60 and the feedback loop comprising the delay element (the block $z^{-1}$) and the amplifier stage 61 having an amplification factor q. When the average value obtained is multiplied by a constant a which is larger than 1, a threshold can be obtained which must not be exceeded by the desired signal. The multiplication takes place in the amplifier stage 62, whilst moreover a signal inversion is effected.

Another possibility (not shown) is that the output signal of the peak detector is multiplied by a number (1/a) smaller than 1 and that the output signal of the device 11 for determining an average value directly acts as a threshold.

The value of the constant a depends upon the kind of the signal that is available. In general, the constant a will be chosen to lie between 1.7 and 2.5. The first-order recursive filter 59 delays the signal over a given time. For a first-order filter 59 having a pole for z = 0.998 (i.e. q = 0.998), this delay is for DC about 500 samples and at 14 Hz about 250 samples. In order to compensate for this delay, the output signal of the peak detector is delayed in the delay unit 12 over roughly the same time. Since this delay is not very critical, it can be chosen approximately equal to 400 to 500 samples, i.e. m∼400 to 500.

If the output of the peak detector exceeds the chosen threshold (i.e. the running average value of the peak level times a), the output signal at the output of the signal combination unit 63 in the comparator 15 is positive. If the output signal of the peak detector is smaller than the threshold, the output signal at the output of the signal combination unit 63 is negative. For detecting a pulse-shaped interference, the sign of the output signal at the output of the signal combination unit 63 is determined. For this purpose, the comparator 15 comprises a block 64 indicated by SGN. The amplifier stage 65 is added in onder to ensure a correct sealing of the amplitude of the output signal at the output 16 in a manner such that this signal can be used for the further processing in the succeeding pulse former 17 (in the case of an embodiment comprising one signal path) and in the signal combination unit 28 (in the case of two signal paths).

It should be noted that a more accurate determination of the threshold can be realized by taking into account the extent to which the average amplitude level varies (differential method) and by determining the signal content of that part of the signal which exceeds the threshold. Thus, an adaptive algorithm can be obtained which generates automatically the multipliciation factor a. This alternative will not be described here further. The output signal of the device 11 for determining an average value is indicated in FIG. 11a by 112 and the output signal of the comparator 15 is indicated in FIG. 11b by 113.

Figure 7:
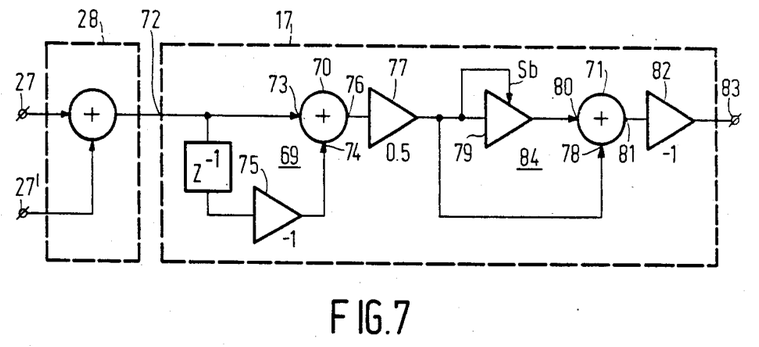
FIG. 7 shows a possible construction for the signal combination unit and the pulse former of the combination circuit of FIG. 3.

It stands to reason that the device 11' for determining an average value, the delay unit 12' and the comparator 15' can be composed in the same manner as shown in FIG. 6 and that signals similar to those indicated in FIG. 11 are also present in the signal path 25' at the relevant points FIG. 7 shows a digital construction for the signal combination unit 28 and the pulse former 17 of FIG. 3. The signal combination unit 28 consists of an adder circuit in which the output signals of the two comparators 15 and 15' (i.e. effectively only the sign bits) are added together. The pulse former 17 comprises a first and a second signal combination unit 70 and 71, respectively. The input 72 of the pulse former 17 is coupled to a first input 73 and through a delay element (the block $z^{-1}$) and an inverting element 75 to a second input 74 of the first signal combination unit 70. The signal combination unit 70 constitutes together with the delay element $z^{-1}$ and the inverting element 75 a differentiator 69. The output 76 of the signal combination unit 70 is coupled through an amplifier stage 77 directly to a first input 78 and through a device 79 for determining an absolute value, in which the digital numbers are multiplied by the sign (bit) Sb, to a second input 80 of the signal combination unit 71. The output 81 of this unit is finally coupled through an inverting element 82 to the output 83. The device 79 for determining an absolute value constitutes together with the signal combination unit 71 the half-wave rectifier 84.

The output signals of the comparators 15 and 15', respectively, exhibit pulses whose width depends upon and varies with the height of the peak level of the pulse-shaped interferences (the higher the peak level, the longer will the output signal of the peak detector exceed the threshold).

In order to realize a standard pulse each time when a pulse-shaped interference is detected, the pulse former 17 is employed. When the output signal of the signal combination unit 28 is differentiated (in the differentiator 69) and by rectification in the half-wave rectifier 84, pulses are obtained at the output 83 which indicate the positions in time of the instants at which both for positive and for negative polarity the signal exceeds the threshold for the first time.

Figure 12:
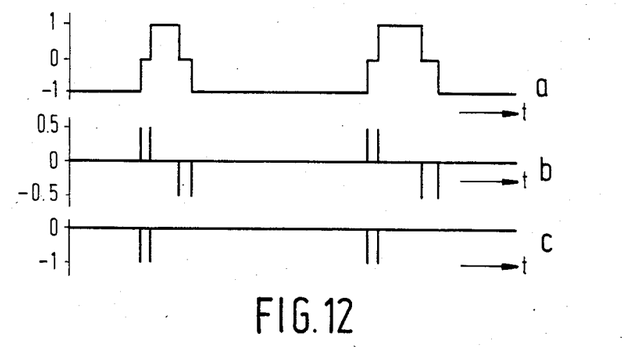

FIG. 12a shows the output signal of the signal combination unit 28, FIG. 12b shows the signals at the output of the amplifier stage 77 and FIG. 12c shows the output signal at the output 83 of the pulse former.

The pulse former 17 of FIG. 7 may also be used in the circuit of FIG. 2. The signal combination unit 28 and the input 27' of FIG. 7 are then omitted. The signals in FIG. 12 also become slightly different with the use of the pulse former 17 of FIG. 7 in the circuit of FIG. 2.

The pulses in FIG. 12c can be used for generating corresponding pulses having a given minimum pulses width. This is realized in the pulse lengthening device 18, of which FIG. 8 shows a digital embodiment.

Figure 8:
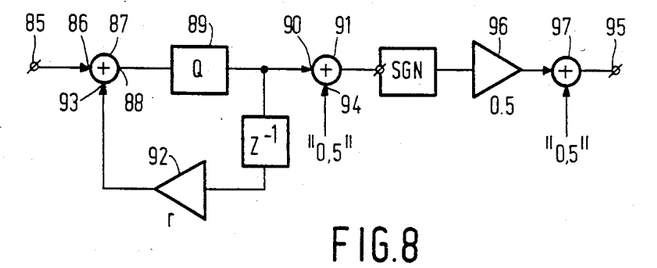
FIG. 8 shows a possible construction for the pulse lengthening device.

If moreover two pulses are supplied to the input 85, which are spaced apart by a time interval smaller than the said minimum pulse width, the circuit of FIG. 8 ensures moreover that the pulse width is increased by the said time between the two pulses. It is necessary to generate pulses having a minimum pulse width in order to have available a sufficiently large time interval so that within this time interval the pulse-shaped interference can occur and can be suppressed. If two pulse-shaped interference moreover occur shortly one after the other, the two pulse-shaped interferences can be suppressed within the same lengthened interval by increasing the width of the pulse.

The input 85 of the pulse lenghening device in FIG. 8 is coupled to a first input 86 of a first signal combination unit 87. The output 88 of this unit is coupled through a quantizer 89, which moreover acts as a limiter, on the one hand to a first input 90 of a second signal combination unit 91 and on the other hand further through a delay element (the block $z^{-1}$) and an amplifier stage 92, in which the signal is multiplied by a factor r, to a second input 93 of the signal combination unit 88.

If a pulse having a value corresponding to the maximum negative sample value (the pulses of FIG. 12c) appears at the input 85 of the circuit of FIG. 8, the output of the delay element $z^{-1}$ will increase from this maximum negative value to zero. The rate of this increase is determined by the value r, which is in this case 0.986.

Due to the fact that in the signal combination unit 91a a constant corresponding to half the value of the full scale is added at the second input 94 to the input signal (i.e. the output signal) of the delay element $z^{-1}$, the signal at the output of the signal combination unit 91 consequently varies between "minus half full scale" and "plus half full scale". When now the sign of the signal in the block indicated by SGN is chosen, a signal having a value "plus full scale" appears at the output 95 as long as the output signal of 91 is positive, whereas a signal having a value "minus full scale" appears at this output during the time interval in which the output signal of 91 is negative. The coeffcent r is chosen so that the minimum pulse width at the output 95 has a length of, for example, 64 samples.

If a second pulse occurs at the input 85 before the content of the delay element $-1$ has become zero, the value of this second pulse is added to the content of the delay element. The quantizer 89 limits the values of the samples stored in the delay element $z^{-1}$ to "minus full scale". Furthermore, if the second pulse occurs before the output signal of combination unit 91 has passed back through zero, the pulse length of the pulse at the output 95 is lengthened exactly by the time interval between the two pulses at the input 85. If this time interval is larger than the aforementioned 64 samples, two separate pulses appear at the output .

Figure 13:
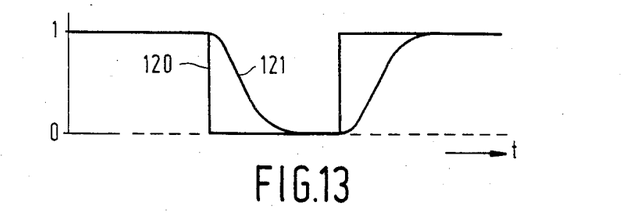

When the output signal of the block SGN is divided in the amplifier stage 6 by two and then in the signal combination unit 97 the "half scale value" is added thereto, a signal is obtained as indicated by 120 in FIG. 13. If this signal is then supplied to the low pass filter of FIG. 9, the signal 121 of FIG. 13 is obtained at the output thereof. This signal can serve as the control signal for controlling the amplifying factor in the suppressor section 3 of FIG. 1 from a value 1 gradually to zero and then controlling it back again to the value 1.

Figure 9:
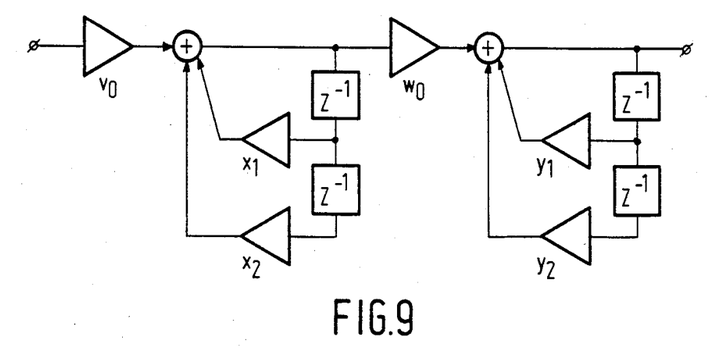
FIG. 9 shows a possible construction of a low-pass filter, which can be connected between the output of the pulse lengthening device and the output of the circuit shown in FIGS. 2 or 3, and FIGS. 10 to 14 show the behaviour of certain signals in the embodiment of FIGS. 3 to 8 as a function of time.

FIG. 9 shows a digital construction of the low pass filter 19. It is in the form of a second order recursive filter having a low-pass filter characteristic of the Gaussean type. The coefficients for the filter are $v_0 = 0.0273$, $x_1 = 1.7354$, $x_2 = -0.7637$, $w_0 = 0.022$, $y_1 = 1.711$, $y_2 = -0.7334$.

FIG. 10 shows the signal 110 as a function of time, which is present at the output of the high-pass filter 8 in FIGS. 2 or 3. The signals 111 and 11' indicate the output signals at the outputs of the peak detectors 10 and 10', respectively. The signal 111' is actually, as stated in the description of FIG. 5, the inverted output signal of the peak detector 10'. These signals clearly show the character and the behaviour of the peak detectors, i.e. the relatively short build-up time of the output signals so that the peaks can be followed rapidly, and the relatively long decay time so that the output signals decay relatively slowly after the occurrence of a peak. It also appears that after the occurrence of a peak having a large amplitude the peak detector is insensitive to the occurrence of successive peaks having smaller amplitudes.

FIG. 11 shows in FIG. 11a again the output signal 110 of the high-pass filter 8 and the output signal 111 of the peak detector 10. Reference numeral 112 denotes the output signal of the device 11 for determining a running average value. FIG. 11b indicates with 113 the output signal of the comparator 15. As long as the output signal of the peak detector 10 is smaller than a times the output signal of the device 11 for determining a running average value, the output signal of the comparator 15 is negative, i.e. equal to $-0.5$, which is half the "full scale" negative value. If the output signal of the peak detector 10 is larger than a times the output signal of the device 11 for determining an average value, the output signal of the comparator 15 is positive, i.e. equal to $+0.5$, which is half the "full scale" positive value.

A similar consideration applies to the detection of peaks having a negative polarity in the signal path 25' of FIG. 3. Also in this case, the output signal of the comparator 15' is negative and positive, respectively, if (the absolute value of) the output signal of the peak detector 10' is smaller and larger, respectively, than a times (the absolute value of) the output signal of the device 11'.

FIG. 12a shows an example of the output signal of the signal combination unit 28 of FIG. 3. Initially the signal has a value "$-$", i.e. "full scale" negative value. This means that the outputs of the comparators 15 and 15' are both negative. Subsequently, the signal in FIG. 12a becomes equal to "0" due to the fact that one of the two outputs 16 and 16' has become positive. In the case of the signal as indicated in FIG. 11a, this can be achieved in that the large-amplitude peak having a negative polarity is detected as a pulse-shaped interference. Subsequently, the signal in FIG. 12a passes to "+1", i.e. "full scale" positive value, due to the fact that both outputs 16 and 16' are now positive. In the case of the signal of FIG. 11a, the large-amplitude peak having a positive polarity, which immediately succeeds the large-amplitude peak having a negative polarity, is now detected as a pulse-shaped interference.

The decay in the signal of FIG. 12a from "+1" to "0" and then from "0" to "-1" is due to the trailing edge of the pulses at the outputs 16 and 16' of the comparators 1 15 and 15'. FIG. 12b shows the output signal of the amplifier stage 77 in FIG. 7. The signal of FIG. 12a is differentiated for this purpose in the differentiator 69 of FIG. 7 and is divided by two in the amplifier stage 77 so that the leading edges in the signal of FIG. 12b and hence the instants of detection of the pulse-shaped interference by pulses in the signal of FIG. 12b having an amplitude equal to half the "full scale" are indicated After half-wave rectification of the signal of FIG. 12b in half-wave rectifier 84 in FIG. 7 and signal inversion in the inverting element 82, the signal of FIG. 12c is obtained at the output 83.

FIG. 13 indicates with 120 the signal at the output 95 of the pulse lengthening device of FIG. 8 and with 121 the control signal at the output 5 in FIGS. 2 or 3, the shape of this control signal determining how the amplification characteristic of the suppressor section 3 in FIG. 1 varies with time in response.

Figure 14:
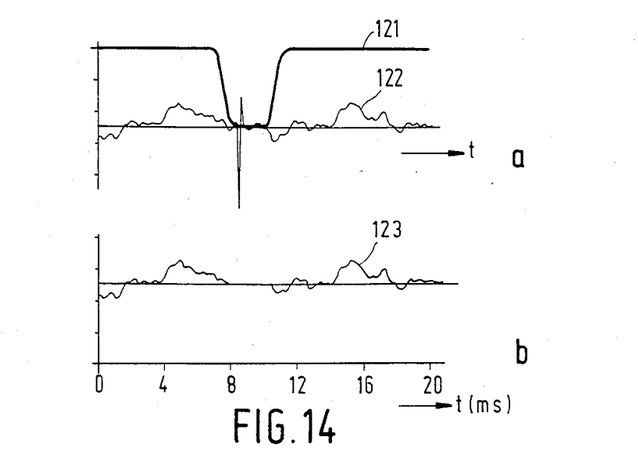

FIG. 14 finally shows the operation of this suppressor section. In FIG. 14a, 122 indicates an input signal which is supplied to the input terminal 1 in FIG. 1. FIG. 14b indicates with 123 the output signal at the output terminal 2 of the suppressor section. It is clear that the pulse-shaped interference in the signal 122 is suppressed. Of course the suppressor section 3 includes a delay element which has to dealy the signal supplied to the input terminal 1 over the time the device 4 needs to detect a pulse-shaped interference.

It should be noted that the invention is not limited to the embodiments described in the Figures. The invention may also be used in arrangements for detecting pulse-shaped interferences, which differ from the embodiments shown at points not relating to the idea on which the invention is based. For example, it is possible to provide the circuit arrangement of FIG. 3 with another combination circuit 26 for obtaining a control signal of a different kind. Further, the circuit arrangement of FIGS. 2 or 3 may be used in arrangements, in which the pulse-shaped interferences are compensated for in a different manner. It is also possible to compose the various circuit arrangements by means of analogous components.

What is claimed is:

1. A circuit for detecting pulse-shaped interferences in an electrical signal comprising:
   an input terminal for receiving the electrical signal;
   a high-pass filter coupled to the input terminal;
   an output terminal for supplying an output signal; and,
   at least one signal path coupling said output terminal and high-pass filter comprising:
   a peak detector, having an input connected to an output of said high-pass filter for producing an output signal having a relatively short build-up time so that relatively rapidly it becomes representative of of a peak value in the electrical signal applied to said input, and a relatively long decay time so that it decays relatively slowly thereafter;
   a device for determining an average value having an input coupled to an output of the peak detector for determining a running average value of the output signal of the peak detector, and for supplying an output signal representative of the running average value;

a comparator having a first and a second input coupled to receive the output signal of the device for determining an average value and to receive the output signal of the peak detector, respectively, for comparing the output signal of the peak detector with the output signal of the device for determining an average value and for supplying to said output terminal output signal representative of the result of comparing.

2. A circuit as claimed in claim 1, wherein the high-pass filter has a cut-off frequency lying between 40 Hz and 1000 Hz and a delay unit is coupled between the output of the peak detector and the second input of the comparator.

3. A circuit as claimed in claim 1, wherein the comparator supplies an output signal if the absolute value of the output signal of the peak detector exceeds a times the absolute value of the running average value of the output signal of the peak detector, a being a constant for which it holds that $a > 1$.

4. A circuit as claimed in claim 1, wherein a rectifier is connected between the output of the high-pass filter and the input of the peak detector.

5. A circuit as claimed in claim 1, further comprising a pulse former coupled between the output of the comparator and the output terminal and having an output for supplying a pulse each time when a pulse-shaped interference is detected by the comparator.

6. A circuit as claimed in claim 5 wherein a pulse lengthening device is coupled to the output of the pulse former for lengthening the pulses of the pulse former up to a given minimum pulse width and for lengthening the pulses of the pulse former by a value corresponding to a time interval between pulse-shaped interferences and succeeding pulse-shaped interferences only if said times interval is smaller than said minimum pulse width.

7. A circuit as claimed in claim 6, wherein a low-pass filter is coupled to an output of the pulse lengthening device.

8. A circuit as claimed in claim 1, wherein the peak detector comprises a first and a second signal combination unit, the input of the peak detector being coupled, through a first amplifir stage, to a first input of both the first and the second signal combination unit, an output of the first signal combination unit being coupled through a device for determining an absolute value to a second input of the second signal combination unit, and an output of the second signal combination unit being coupled to the output of the peak detector and through a delay element and a second amplifier stage to both a second input of the first signal combination unit and a third input of the second signal combination unit.

9. A circuit as claimed in claim 5, wherein the pulse former comprises a first and second signal combination unit, an input of the pulse former being coupled to a first input and through a delay element to a second input of the first signal combination unit, and in that an output of the first signal combination unit is coupled, through an amplifier stage to a first input of the second signal combination unit and through a device for determining an absolute value to a second input of the second signal combination unit, the second signal combination unit having an output coupled to the output of the pulse former.

10. A circuit as claimed in claim 6, wherein the pulse lengthening device comprises a first and a second pulse combination unit and a limiter, an input of the pulse lengthening device is coupled to a first input of the first signal combination unit, an output of the first signal combination unit is coupled through the limiter, a delay element and an amplifier stage to a second input of the first signal combination unit, and an output of the limiter is coupled to a first input of the second signal combination unit, of which a second input receives a constant signal and an output of which is coupled to an output of the pulse lengthening device.

11. A circuit for detecting pulse-shaped interferences in an electrical signal comprising:
  (a) an input terminal for receiving the electrical signal;
  (b) a high-pass filter coupled to the input terminal;
  (c) an output terminal for supplying an output signal;
  (d) at least first and second signal paths extending in parallel each coupled to an output of the high-pass filter, each path comprising:
    (i) a peak detector having an input connected to the output of said high-pass filter for producing an output signal having a relatively short build-up time so that relatively rapidly it becomes representative of the value of the peak value in the signal applied to said input, and a relatively long decay time, so that it decays relatively slowly thereafter, the peak detector in the first signal path being constructed to detect peaks of one polarity in its input signal, and the peak detector in the second signal path being constructed to detect peaks of the other polarity in its input signal;
    (ii) a device for determining an average value having an input coupled to an output of the peak detector for determining a running average value of the output of the peak detector, and for supplying an output signal representative of said running average value; and
    (iii) a comparator having a first and second input coupled to receive the output signal of the device for determining an average value and to receive an output signal of the peak detector, respectively, for comparing the output signal of the peak detector with an output signal of the device for determining an average value and for supplying an output signal representative of the result of comparing; and
  (e) a combination circuit having a first and second input coupled to an output of the comparator in one signal path and to an output of the comparator in another signal path, respectively, for combining the output signals of the comparators, an output of the combination circuit being coupled to the output terminal.

12. A circuit as claimed in claim 11, wherein the combination circuit comprises a signal combination unit having a first and a second input coupled to the first and the second input of the combination circuit as well as an output, and a pulse former coupled to the output of the signal combination unit for supplying a pulse each time a pulse-shaped interference is detected by one of the comparators.

13. A circuit for detecting and suppressing pulse-shaped interferences in an electrical signal comprising:
  (a) a first input terminal for receiving the electrical signal;
  (b) an output terminal;

(c) a suppressor section coupled between the input terminal and the output terminal having a control input for receiving a control signal, said suppressor section suppressing the electrical signal at said output terminal in response to the control signal;

(d) a circuit for detecting pulse-shaped interferences comprising:

(i) a second input terminal for receiving the electrical signal;

(ii) a high-pass filter coupled to the second input terminal;

(iii) an output coupled to the control input of the suppressor section, for supplying the control signal to the control input of the suppressor section; and (iv) at least one signal path coupling said high-pass filter to said output of said circuit for detecting pulse-shaped interferences comprising:

(A) a peak detector, having an input connected to an output of said high-pass filter for producing an output signal having a relatively short build-up time so that relatively rapidly it becomes representative of the value of a peak value in the electrical signal applied to said second input and a relatively long decay time so that it decays relatively slowly thereafter;

(B) a device for determining an average value, having an input coupled to an output of the peak detector, for determining a running average value of the output signal of the peak detector, and for supplying an output signal representative of said running average value; and (C) a comparator having a first and second input coupled to receive the output signal of the device for determining an average value and to receive an output signal of the peak detector, respectively, for comparing the output signal of the peak detector with an output signal of the device for determining an average value and for supplying an output signal representative of comparing to the output of said circuit for detecting pulse-shaped interferences.

* * * * *